(12) United States Patent
Ramet et al.

(10) Patent No.: US 7,324,788 B2
(45) Date of Patent: Jan. 29, 2008

(54) RF INTEGRATED CIRCUIT COMPRISING A FREQUENCY SYNTHESIZER NOT VERY SENSITIVE TO INJECTION LOCKING

(75) Inventors: Serge Ramet, Grenoble (FR); Pascal Triaire, Grenoble (FR); Philippe Jouen, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 552 days.

(21) Appl. No.: 11/036,180

(22) Filed: Jan. 14, 2005

(65) Prior Publication Data

US 2005/0186918 A1  Aug. 25, 2005

(30) Foreign Application Priority Data

Jan. 16, 2004  (FR) .................................. 04 00414

(51) Int. Cl.
*H04B 1/40* (2006.01)
*H03C 3/06* (2006.01)
(52) U.S. Cl. .................. 455/76; 455/119; 332/126
(58) Field of Classification Search ............. 455/76, 455/119; 332/126–128
See application file for complete search history.

(56) References Cited

U.S. PATENT DOCUMENTS

| 4,937,536 | A | * | 6/1990 | Reinhardt et al. .............. 331/8 |
| 5,434,887 | A | | 7/1995 | Osaka ........................ 375/295 |
| 5,717,730 | A | | 2/1998 | Prakash et al. ............. 375/376 |
| 6,321,074 | B1 | * | 11/2001 | Lemay ........................ 455/260 |
| 6,526,265 | B1 | * | 2/2003 | Damgaard et al. .......... 455/118 |
| 6,744,324 | B1 | * | 6/2004 | Adams et al. ................. 331/17 |
| 6,961,547 | B2 | * | 11/2005 | Rozenblit et al. ........... 455/118 |
| 7,098,754 | B2 | * | 8/2006 | Humphreys et al. ........ 332/103 |

FOREIGN PATENT DOCUMENTS

WO    WO 01/01562 A1    1/2001

\* cited by examiner

*Primary Examiner*—Duc M. Nguyen
(74) *Attorney, Agent, or Firm*—Lisa K. Jorgenson; David V. Carlson; Seed IP Law Group PLLC (57) ABSTRACT

The present invention relates to an RF integrated circuit comprising a frequency synthesizer and a QAM modulator for modulating a baseband signal of frequency $F_{BB}$, the frequency synthesizer supplying to the QAM modulator an output signal of frequency F1 adjustable with a frequency step $\Delta F1$, for forming a carrier signal of the QAM modulator. According to the present invention, the frequency synthesizer is a Vernier effect frequency synthesizer comprising an auxiliary frequency synthesizer supplying an auxiliary signal of frequency F2 adjustable with a frequency step $\Delta F2$ and a main frequency synthesizer having a phase-locked loop bandwidth at least two times higher than the frequency step $\Delta F2$ of the auxiliary signal.

26 Claims, 3 Drawing Sheets

RF INTEGRATED CIRCUIT COMPRISING A FREQUENCY SYNTHESIZER NOT VERY SENSITIVE TO INJECTION LOCKING

FIELD OF THE INVENTION

The present invention relates to frequency synthesizers comprising a voltage-controlled oscillator and a phase-locked loop.

More particularly, the present invention relates to an RF integrated circuit comprising a frequency synthesizer and a QAM modulator for modulating a baseband signal of frequency $F_{BB}$, the frequency synthesizer supplying to the QAM modulator an output signal of frequency F1 adjustable with a frequency step $\Delta$F1, for forming a carrier signal of the QAM modulator.

The present invention also relates to a method for reducing the injection locking effect in an RF integrated circuit comprising a frequency synthesizer and a QAM modulator for modulating a baseband signal of frequency $F_{BB}$, the frequency synthesizer supplying to the QAM modulator an output signal of frequency F1 adjustable with a frequency step $\Delta$F1, for forming a carrier signal of the QAM modulator, the injection locking effect being due to the injection of spurious signals coming from the QAM modulator into the frequency synthesizer.

BACKGROUND OF THE INVENTION

In RF circuits combining a frequency synthesizer and a QAM modulator (quadrature amplitude modulation), leakages of fundamental, harmonic or mixed signals from the QAM modulator deteriorate the performances of the voltage-controlled oscillator present in the frequency synthesizer, due to an injection pulling effect also known as injection locking.

Figure 1:
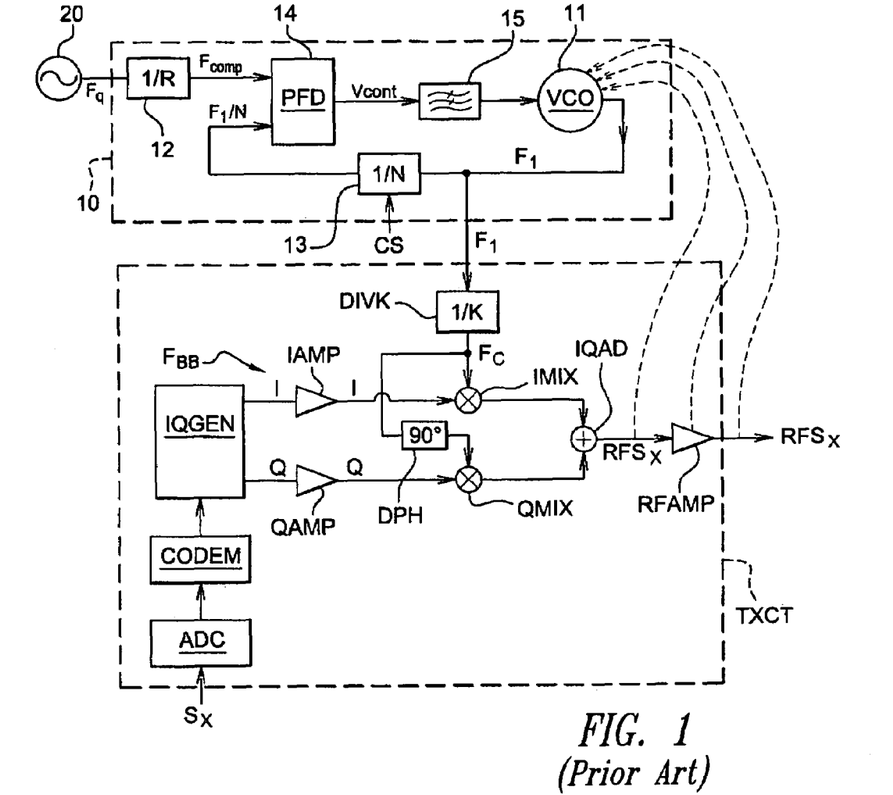
FIG. 1 described above represents a classical frequency synthesizer coupled to a transmit RF circuit, FIG. 2 described above represents a classical frequency synthesizer the output signal of which is supplied by a mixer, FIG. 3 described above represents another classical frequency synthesizer the output signal of which is supplied by a mixer.

FIG. 1 represents a radiotelephony RF integrated circuit in which the injection locking effect constitutes a fundamental problem for those skilled in the art. This RF integrated circuit comprises a frequency synthesizer 10 and a QAM modulator, the QAM modulator here forming a transmit radio frequency circuit TXCT.

The frequency synthesizer 10 is driven by a quartz oscillator 20 and supplies to the circuit TXCT an output signal of frequency F1 adjustable with a determined frequency step. Typically, the frequency F1 is of 3.6 GHz and is adjustable from 3.2 GHz to 4 GHz with a step of 400 KHz.

In the following description, the "rank" of a frequency divider will designate the division coefficient of the frequency divider considered.

The frequency synthesizer 10 comprises a voltage-controlled oscillator 11 (VCO), a frequency divider 12 of rank R and a phase-locked loop. The phase-locked loop comprises a frequency divider 13 of rank N, a phase comparator 14 (PFD) and a loop filter 15 of low-pass type. The rank N of the frequency divider 13 is programmable by means of a signal CS ("Channel Selection") applied to a control input of the frequency divider.

The output signal of frequency F1 is supplied by the oscillator 11, and is sent back to the input of the frequency divider 13. The latter supplies a signal of frequency F1/N that is applied to a first input of the phase comparator 14. The phase comparator receives at a second input a comparison signal of frequency Fcomp, supplied by the frequency divider 12 the input of which receives a signal of frequency Fq supplied by the quartz oscillator 20 (Fcomp=Fq/R). The output of the phase comparator 14 supplies a control signal Vcont that is applied to the oscillator 11 through the loop filter 15. The signal of frequency F1 is thus frequency and phase controlled, and the frequency F1 is equal to N*Fcomp, Fcomp representing the frequency step of the output signal. Typically Fcomp is in the order of 400 KHz for a baseband frequency $F_{BB}$ of 200 KHz, and N varies between 8,000 and 10,000.

The circuit TXCT or QAM modulator receives an analog signal $S_x$ and the signal of frequency F1, and supplies an antenna signal RFSx that is phase modulated. The signal RFSx is applied to an RF antenna that is not represented on the Figure.

The signal of frequency F1 is applied to a frequency divider DIVK of rank K, the output of which supplies a carrier Fc of the radio channel, Fc being equal to F1/K, K generally being equal to 2 for the DCS band (1.8 GHz) and to 4 for the GSM band (900 MHz).

The signal Sx is digitised by a converter ADC, then is applied to an encoder modem CODEM then is again applied to a processor IQGEN. The processor IQGEN supplies, in the baseband of frequency $F_{BB}$, a phase signal I and a quadrature signal Q to be modulated with the carrier Fc. The signal I is applied to an input of a mixer IMIX through an amplifier IAMP, and the signal Q is applied to an input of a mixer QMIX through an amplifier QAMP. The mixer IMIX receives the carrier Fc at another input and the mixer QMIX receives at another input the carrier Fc off-phased by 90°, supplied by a phase-shifter DPH. The outputs of the mixers IMIX, QMIX are applied to an adder IQAD that supplies the modulated signal RFSx. The signal RFSx is applied to an output amplifier RFAMP the output of which supplies the antenna signal.

The signal Sx generally contains data to be transmitted, such as a coded voice for example, and has a frequency spectrum representative of the modulation scheme provided for by the standard implemented (for example GMSK in GSM). By considering as an example that the signal Sx is a single tone, the circuit IQGEN then supplies two pure quadrature sinusoids I=cos($F_{BB}$) and Q=sin($F_{BB}$). The result of the phase modulation IQ is in this case a single tone of frequency Fc+$F_{BB}$ the image component Fc−$F_{BB}$ of which is in principle removed by the quadrature modulation, and the carrier Fc of which is also removed, or at least greatly attenuated.

Due to imperfections in the modulation circuit and in the output amplifier RFAMP, or non-linearities, the signal RFSx comprises, in addition to the useful component H1 of frequency Fc+$F_{BB}$, harmonic components H2, H3, H4, . . . Out of these components, at least one is close to the oscillation frequency F1 of the oscillator 11 of the frequency synthesizer 10 and forms a spurious component that is re-injected into the oscillator via various spurious paths (electromagnetic coupling and propagation in the substrate). In particular, it is the second harmonic H2 when the frequency divider DIVK is a divider by 2 (DCS band) or the fourth harmonic H4 when the frequency divider DIVK is a divider by 4 (GSM band). Indeed, when K=2 the frequency of the second harmonic H2 is equal to 2Fc+2$F_{BB}$ (i.e., F1+2$F_{BB}$) and is very close to the central frequency F1 of the oscillator 11 since the baseband frequency $F_{BB}$ is low in relation to the carrier Fc. Similarly, when K=4 the fourth harmonic H4 has a frequency of 4Fc+4$F_{BB}$ (i.e., F1+4$F_{BB}$) that is close to the central frequency of the oscillator 11. This spurious component can also be the useful component H1 itself, in a circuit in which K is equal to 1.

It is well known that the involuntary injection of this spurious component into the core of the oscillator deteriorates the performances of the latter. Indeed, the phase-locked loop does not manage to totally remove the spurious component that is therefore re-injected into the output signal of the voltage-controlled oscillator. An injection locking effect follows, since the spurious component re-injected into the output signal of the oscillator then comes back into the core of the oscillator via spurious paths, is again re-injected into the output signal, and so on and so forth.

Various solutions are known to overcome this disadvantage.

First of all, it is frequent for the voltage-controlled oscillator to be produced on a silicon microchip distinct from the one bearing the circuit TXCT. However, this solution is complex to implement and burdens the cost price of the RF circuits, which is passed on, at the end of the line, to the selling price of mobile telephones. Thus, the current tendency is, on the contrary, to integrate the oscillator into the silicon microchip bearing the transmission circuit TXCT. Integrating, onto the same silicon microchip, the output amplifier RFAMP that is not linear and constitutes a considerable source of high-amplitude spurious harmonics, is also considered.

Another solution involves shifting the frequency of the carrier Fc in relation to the central frequency of the voltage-controlled oscillator. Thus, the heterodyne systems use several voltage-controlled oscillators and several cascaded mixers, and a pre-modulation stage using an intermediary frequency IF. In the output stage, the carrier frequency of the modulated signal is shifted relative to the natural frequency of the voltage-controlled oscillator, and the signals likely to interfere with the voltage-controlled oscillator are harmonic and/or high-rank mixed products that are greatly attenuated. Heterodyne systems are however complex and costly to produce, as are the additional mixers and filters.

Yet another solution involves providing a frequency synthesizer supplying an output signal the frequency of which is shifted relative to the central frequency of the voltage-controlled oscillator.

Figure 2:
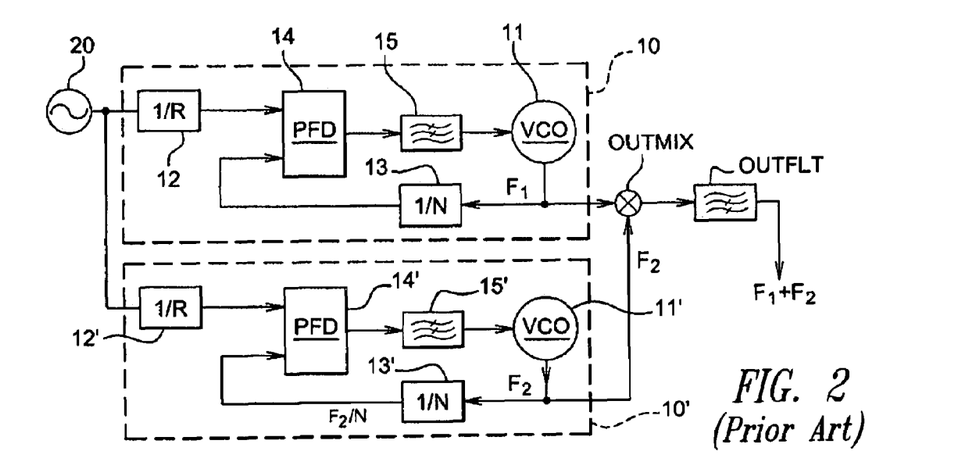

FIG. 2 represents a circuit conforming to this solution. The circuit represented comprises two frequency synthesizers 10, 10' driven by the same quartz oscillator 20. Each frequency synthesizer is of a structure similar to the one in FIG. 1 and comprises a voltage-controlled oscillator 11, 11', a frequency divider 12, 12' of rank R, a frequency divider 13, 13' of rank N, a phase comparator 14, 14' and a loop filter 15, 15'. Each voltage-controlled oscillator 11, 11' supplies a signal of frequency F1, respectively F2. The two signals are applied to a mixer OUTMIX which supplies an output signal comprising an additive component of frequency F1+F2 and a subtractive component of frequency F2−F1. The output signal of the mixer is applied to a filter OUTFLT that removes one of the components, such as the subtractive component for example, so as to keep only the other component as output signal of the circuit. Thus, the harmonic signals of the output signal, of frequency F1+F2, are far from the central frequencies of each of the voltage-controlled oscillators, and their interference is reduced.

Figure 3:
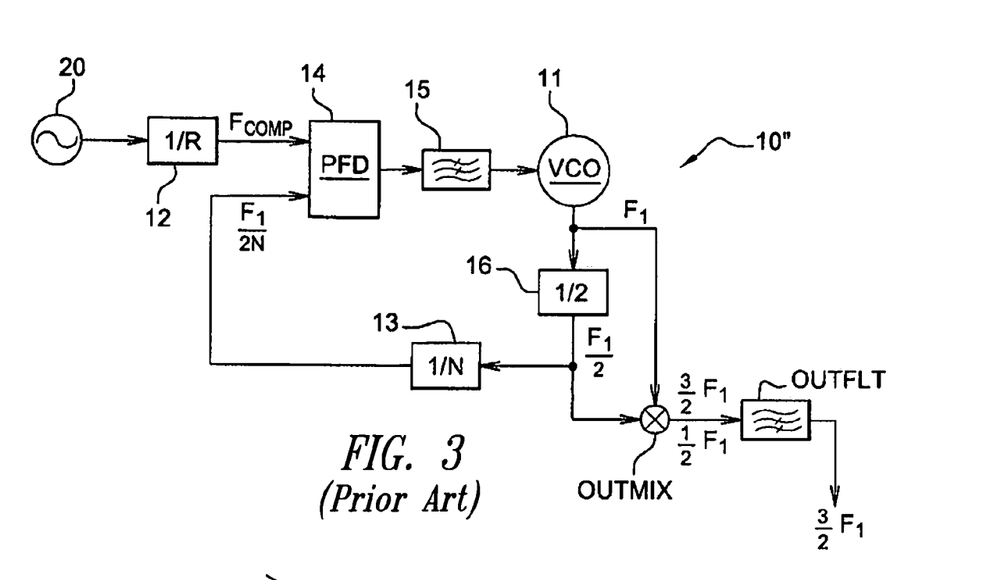

Along the same lines, FIG. 3 represents a frequency synthesizer 10" as described by U.S. Pat. No. 6,321,1074. The frequency synthesizer is driven by a quartz oscillator 20 and comprises, like the one in FIG. 1, a voltage-controlled oscillator 11, a frequency divider 12, a frequency divider 13, a phase comparator 14 and a loop filter 15. A frequency divider 16 of rank 2 is here inserted into the phase-locked loop, between the output of the oscillator 11 and the input of the frequency divider 13. The output signal of the oscillator 11, of frequency F1, is applied to an input of an output mixer OUTMIX another input of which receives the signal supplied by the frequency divider 16, of frequency F1/2. The output signal of the mixer thus comprises an additive component of frequency F1+F1/2 i.e., 3/2*F1 and a subtractive component of frequency F1−F1/2 i.e., F1/2. An output filter OUTFLT removes the subtractive component. Thus, the harmonics of the output signal have frequencies (3*F1, 4,5*F1, 6*F1 . . . ) that are far from the central frequency F1 of the oscillator 11, and their interference is reduced.

The disadvantage of these two frequency synthesizers is that the output signal is supplied by a mixer, and that it is necessary to greatly filter the output of the mixer so as to only keep the useful frequency. Such filtering most often requires an external component, and increases the cost price and the complexity of the RF integrated circuit.

BRIEF SUMMARY OF THE INVENTION

According to principles of the present invention, the injection locking effect in such RF circuits, is reduced.

The present invention provides an RF integrated circuit comprising a frequency synthesizer and a QAM modulator, wherein the frequency synthesizer is not very sensitive to the spurious signals coming from the QAM modulator.

Preferably, the output signal of the frequency synthesizer is not supplied by a mixer.

To achieve this object, the present invention is based on an in-depth study of the interference mechanisms occurring in a voltage-controlled oscillator. At the end of the study, it was noticed that the more the bandwidth BW of the phase-locked loop is extended, the less the voltage-controlled oscillator is sensitive to the spurious signals.

However, an extension of the bandwidth BW of the phase-locked loop cannot be considered in a classical frequency synthesizer, since it is a general rule that this bandwidth BW must not exceed approximately ¹⁄₁₀ of the comparison frequency Fcomp (i.e., the frequency step). This rule aims to guarantee the stability of the phase-locked loop. With a frequency step of 400 KHz (typical value currently in GSM or DCS radiotelephony) this constraint limits the loop bandwidth to 40 or 50 KHz.

To achieve an operational circuit that overcomes this obstacle, one embodiment of the present invention uses a Vernier effect frequency synthesizer as frequency synthesizer supplying to the QAM modulator the signal of frequency F1 enabling the carrier signal Fc to be formed.

Vernier effect frequency synthesizers are used in the current state of the technique as phase modulators. They comprise a main frequency synthesizer and an auxiliary frequency synthesizer, the latter supplying to the main frequency synthesizer an auxiliary signal of frequency F2, the main frequency synthesizer supplying a main signal of frequency F1. The frequency step $\Delta F1$ of the main signal F1 varies according to the frequency step $\Delta F2$ of the auxiliary signal of frequency F2, which characterises the Vernier effect. In the current state of the technique, the auxiliary signal of frequency F2 is modulated with the baseband signal of frequency $F_{BB}$, and this modulation is also found in the output signal of frequency F1 of the main frequency synthesizer, the Vernier effect frequency synthesizer thus forming a phase modulator.

Thus, the present invention proposes using a Vernier effect frequency synthesizer as "ordinary" frequency synthesizer, rather than as phase modulator.

Indeed, given that, in such a frequency synthesizer, the frequency step of the main signal F1 varies according to the frequency step of the auxiliary signal F2, it becomes possible to apply to the main frequency synthesizer a comparison signal having a high frequency compared to the classical 400 kHz, and to provide in the main frequency synthesizer a phase-locked loop having an extended bandwidth that is much higher than $\frac{1}{10}$ of the frequency step of the auxiliary signal. Also, according to another aspect of the present invention, the frequency F2 of the auxiliary frequency synthesizer is chosen to be sufficiently far from the frequency F1 so as not to be sensitive to the spurious signals sent by the QAM modulator.

More particularly, the present invention provides an RF integrated circuit of the aforementioned type, wherein the frequency synthesizer is a Vernier effect frequency synthesizer comprising an auxiliary frequency synthesizer supplying an auxiliary signal of frequency F2 adjustable with a frequency step ΔF2, and a main frequency synthesizer supplying the output signal of frequency F1 and comprising a phase-locked loop comprising means for mixing the output signal of frequency F1 with the auxiliary signal of frequency F2, such that the frequency step ΔF1 of the output signal is equal or proportional to the frequency step ΔF2 of the auxiliary signal, and wherein the bandwidth of the phase-locked loop of the main frequency synthesizer is as least two times higher than the frequency step ΔF2 of the auxiliary signal.

According to one embodiment, the deviation between the frequencies F2 and F1 is higher than several tens of times the baseband frequency $F_{BB}$.

According to one embodiment, the main frequency synthesizer comprises a voltage-controlled oscillator supplying the output signal of frequency F1, and a phase comparator receiving at input a comparison signal of determined frequency and a subtractive component of frequency F2-F1 supplied by the means for mixing the output signal of frequency F1 with the auxiliary signal of frequency F2.

According to one embodiment, the frequency of the comparison signal is at least 20 times higher than the frequency step ΔF2 of the auxiliary signal.

According to one embodiment, the comparison signal is a fixed frequency signal, such that the frequency step ΔF1 of the output signal is equal to the frequency step ΔF2 of the auxiliary signal.

According to one embodiment, the main frequency synthesizer comprises a frequency divider of rank P receiving the auxiliary signal at input and supplying the comparison signal, such that the output signal has a frequency step ΔF1 equal to the frequency step ΔF2 of the auxiliary signal multiplied by a term that varies according to P.

According to one embodiment, the frequency F2-F1 of the subtractive component is in the order of 300 MHz.

According to one embodiment, the auxiliary frequency synthesizer comprises a voltage-controlled oscillator and a phase-locked loop, the voltage-controlled oscillator of the auxiliary frequency synthesizer supplying the auxiliary signal, the phase-locked loop of the auxiliary frequency synthesizer enabling the frequency F2 of the auxiliary signal to be adjusted.

According to one embodiment, the auxiliary frequency synthesizer is driven by a quartz oscillator linked to a frequency divider of rank R that supplies a comparison signal of determined frequency to the phase-locked loop of the auxiliary frequency synthesizer.

According to one embodiment, the frequency F2 of the auxiliary signal is higher than the frequency F1 of the output signal.

According to one embodiment, the frequency F1 of the output signal is in the order of 3 to 4 GHz.

According to one embodiment, the phase-locked loop of the main frequency synthesizer has a bandwidth between 1 and 30 MHz.

According to one embodiment, the frequency step ΔF1 of the output signal is in the order of 400 KHz.

The present invention also relates to a method for reducing the injection locking effect in an RF integrated circuit of the aforementioned type, comprising using, as a frequency synthesizer, a Vernier effect frequency synthesizer comprising an auxiliary frequency synthesizer supplying an auxiliary signal of frequency F2 adjustable with a frequency step ΔF2, and a main frequency synthesizer supplying the output signal of frequency F1 and comprising a phase-locked loop comprising means for mixing the output signal of frequency F1 with the auxiliary signal of frequency F2, such that the frequency step ΔF1 of the output signal is equal or proportional to the frequency step ΔF2 of the auxiliary signal, and wherein the bandwidth of the first phase-locked loop is chosen to be at least two times higher than the frequency step ΔF2 of the auxiliary signal.

According to one embodiment, the comparison signal is obtained by dividing the frequency F2 of the auxiliary signal by a number P, such that the output signal has a frequency step ΔF1 equal to the frequency step ΔF2 of the auxiliary signal multiplied by a term that varies according to P.

According to one embodiment, the frequency F2-F1 of the subtractive component is in the order of 300 MHz.

According to one embodiment, the frequency F2 of the auxiliary signal is chosen to be higher than the frequency F1 of the output signal.

BRIEF DESCRIPTION OF THE SEVERAL VIEWS OF THE DRAWING(S)

These and other objects, features and advantages of the present invention will be explained in greater detail in the following description of an example of an embodiment of a frequency synthesizer according to the present invention, given in relation with, but not limited to, the following figures.

DETAILED DESCRIPTION OF THE INVENTION

Figure 4:
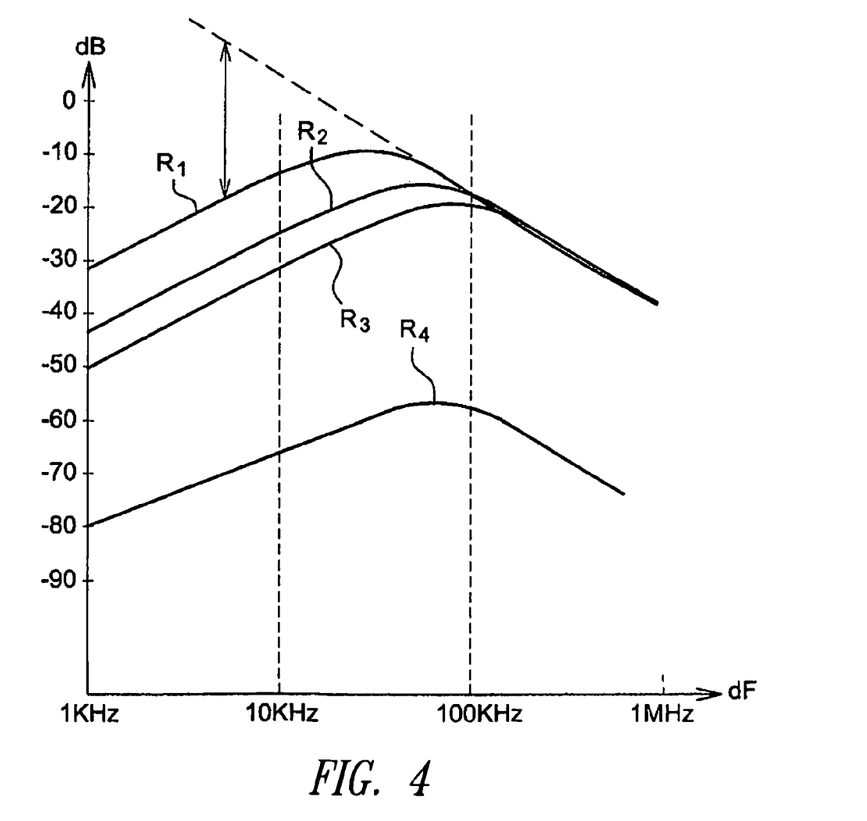
FIG. 4 represents various rejection curves of a spurious signal for various bandwidth values of a phase-locked loop.

The curves R1, R2, R3 represented in FIG. 4 are the transfer functions of three phase-locked loops having respective bandwidths of 0-30 KHz, 0-60 KHz, and 0-100 KHz. These transfer functions represent the level of spurious signals at output of a frequency synthesizer 10 of the type described above in relation with FIG. 1, the spurious signals being sent by the QAM modulator (circuit TXCT).

The horizontal axis is graduated in differential frequency dF according to a logarithmic scale, i.e., the difference between the frequency of the spurious signal and the central frequency of the voltage-controlled oscillator. The vertical axis is graduated in relative level according to a logarithmic scale, i.e., the ratio between the level of the signal at the frequency considered and the level of the signal at the central frequency of the voltage-controlled oscillator.

The negative slope straight line represented in dotted lines represents the transfer function of the oscillator alone, without the phase-locked loop. This transfer function decreases when dF increases. The difference between the straight line in dotted lines and the curves R1, R2, R3 is representative of the rejection of the spurious signal performed by the locked loop in relation to the oscillator alone. The rate of rejection decreases when dF increases until it is cancelled out when dF is equal to the bandwidth of the locked loop.

By comparing the curves R1, R2, R3, it can be seen that the wider the bandwidth is the more the maximum level of the interference decreases. It can also be seen that, for a given differential frequency dF, the level of the spurious signals decreases when the bandwidth increases.

The present invention is based on this observation and aims to provide a frequency synthesizer structure that enables the bandwidth of a phase-locked loop to be set to a high value.

More particularly, the present invention provides for replacing the classical frequency synthesizer in an RF integrated circuit of the type described above by a Vernier effect frequency synthesizer, comprising two cascaded frequency synthesizers, and for giving one of the frequency synthesizers a wide loop bandwidth.

Figure 5:
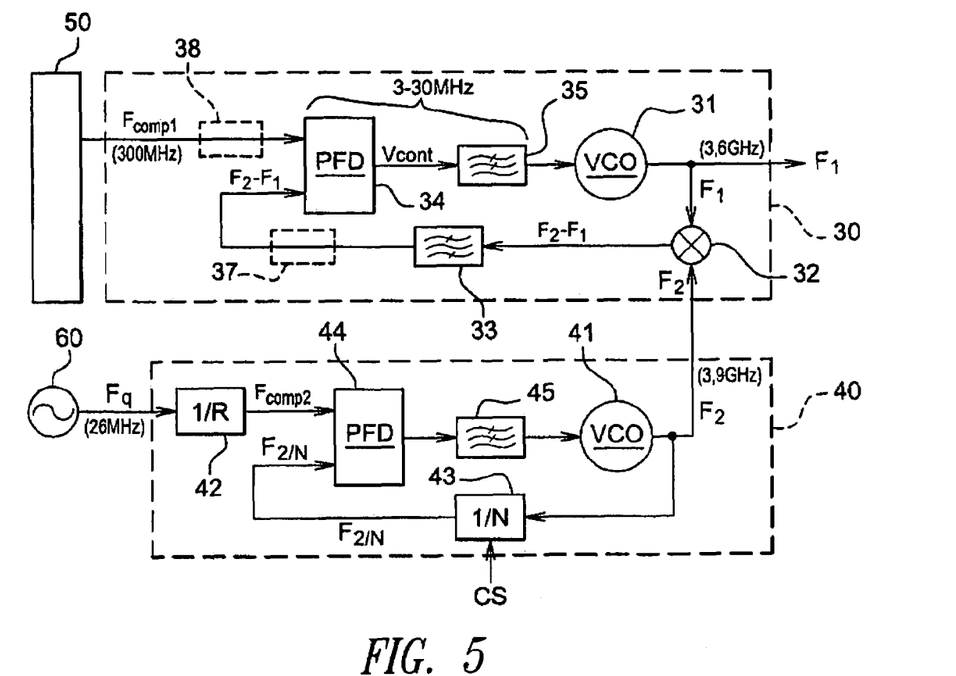
FIG. 5 represents a frequency synthesizer according to the present invention, driven by an auxiliary signal supplied by an auxiliary frequency synthesizer.

Such a Vernier effect frequency synthesizer is represented in FIG. 5 and comprises a main frequency synthesizer 30 and an auxiliary frequency synthesizer 40.

The frequency synthesizer 30 comprises a voltage-controlled oscillator 31 and a phase-locked loop comprising a mixer 32, a filter 33, a phase comparator 34 and a loop filter 35 of low-pass type. The oscillator 31 supplies a signal of frequency F1 that forms the output signal of the frequency synthesizer. The phase comparator 34 receives the signal of frequency F1 at a first input and at a second input an auxiliary signal of frequency F2 adjustable with a frequency step $\Delta F2$, supplied by the auxiliary frequency synthesizer 40. The output of the mixer 32 supplies a mixed signal comprising an additive component of frequency F2+F1 and a subtractive component of frequency F2−F1. The mixed signal is applied to the filter 33, here a band-pass filter provided to remove the additive component. The output of the filter 33 thus supplies a signal of frequency F2−F1 that is applied to a first input of the phase comparator 34. The phase comparator receives at a second input a comparison signal of frequency Fcomp1, here supplied by a second auxiliary circuit 50. The output of the phase comparator supplies a control signal Vcont that is applied to the oscillator 31 through the loop filter 35.

The equation of the phase-locked loop of the frequency synthesizer 30 is as follows:

$$F2-F1=F\text{comp}1$$

i.e.:

$$F1=F2-F\text{comp}1$$

To obtain a frequency F1 of 3.6 GHz, Fcomp1 is for example equal to 300 MHz and F2 equal to 3.9 GHz.

Furthermore, the variations of the frequency F2 are passed on to the signal F1 as follows, the frequency Fcomp1 being taken to be constant:

$$F1+\Delta F1=F2+\Delta F2-F\text{comp}1$$

i.e.:

$$F1+\Delta F1=F2-F\text{comp}1+\Delta F2$$

i.e.:

$$F1+\Delta F1=F1+\Delta F2$$

i.e.:

$$\Delta F1=\Delta F2$$

Thus, the variations of the auxiliary frequency F2 here lead to similar variations of the frequency F1 of the output signal, which characterises the Vernier effect.

The advantage of such a structure of frequency synthesizer is that the bandwidth of the phase-locked loop can be chosen to be high by choosing a high comparison frequency Fcomp1. Thus, if the comparison frequency Fcomp1 is 300 MHz according to the aforementioned example, the bandwidth of the locked loop can be chosen to be up to 30 MHz by applying the classical rule of the 1/10. Such an extended bandwidth, almost 1,000 times higher than the bandwidth of the phase-locked loop of a classical frequency synthesizer, gives the phase-locked loop a rate of rejection of the spurious signals that is much higher than a classical phase-locked loop.

On FIG. 4, the curve R4 represents the transfer function of the phase-locked loop according to the present invention. This is of a shape similar to that of the curves R1, R2, R3 but is shifted by −50 dB relative to the curve R1 in the modulation bandwidth of the voltage-controlled oscillator, i.e., an excellent rate of rejection allowing the injection locking effect to be substantially reduced.

In practice, technical constraints that are per se not related to the present invention can result in a loop bandwidth being chosen that is lower than the one provided by the theoretical calculation. Such technical constraints are rules dictated by standards that aim to remove, in the output signal, the noise produced by certain elements present in the frequency synthesizers (such as the noise of a charge pump present in the phase comparator for example). Thus, the bandwidth of the phase-locked loop could, in practice, be set to within the vicinity of 3 MHz instead of being set to 30 MHz. However, even in this case, the bandwidth of the loop remains almost 100 times higher than the bandwidth of a classical phase-locked loop, and the rate of rejection of the spurious signals remains very high.

The setting of the bandwidth of the phase-locked loop according to the present invention is, per se, an operation within the understanding of those skilled in the art. The bandwidth of the loop varies, in particular, according to the bandwidth and the attenuation coefficient of the loop filter 35, of the gain of the phase comparator 34 and of the gain of the mixer 32.

As represented in FIG. 5, the auxiliary frequency synthesizer 40 is driven by a quartz oscillator 60 and comprises a voltage-controlled oscillator 41, a frequency divider 42 of rank R and a phase-locked loop. The phase-locked loop classically comprises a frequency divider 43 of rank N, a phase comparator 44 and a low-pass loop filter 45. The rank N of the frequency divider 43 is programmable by means of a signal CS applied to the frequency divider, which enables the number of frequency steps ΔF2 that the frequency F2 comprises to be varied.

The oscillator 41 supplies the auxiliary signal of frequency F2. The frequency divider 43 receives the signal of frequency F2 and supplies a signal of frequency F2/N at an input of the phase comparator 44. The phase comparator receives at another input a comparison frequency Fcomp2, supplied by the frequency divider 42 the input of which receives a signal of frequency Fq supplied by the oscillator 60. The output of the phase comparator 44 supplies a control signal Vcont that is applied to the oscillator 41 through the loop filter 45. The frequency F2 is therefore equal to N*Fcomp2, Fcomp2 representing the frequency step ΔF2 of the auxiliary signal.

The second auxiliary circuit 50, which supplies the comparison signal of frequency Fcomp1, can also be a classical frequency synthesizer. However, according to one advantageous embodiment of the present invention, the comparison signal of frequency Fcomp1 is produced by means of the auxiliary signal supplied by the auxiliary frequency synthesizer 40.

Figure 6:
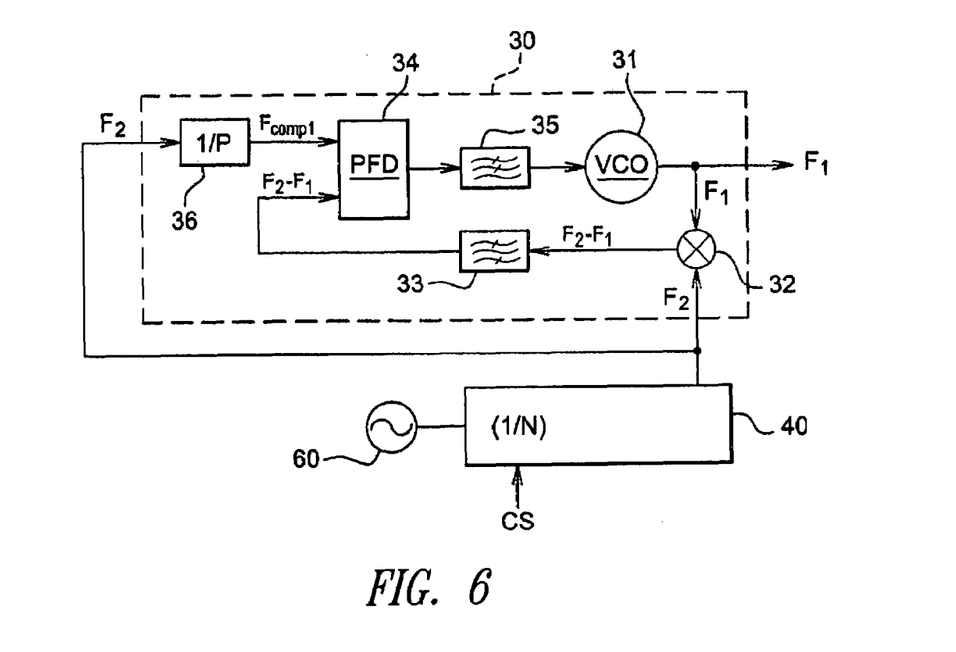
FIG. 6 represents an alternative embodiment of the frequency synthesizer in FIG. 5.

FIG. 6 represents such an embodiment. The frequency synthesizer 30 comprises, in addition to the elements described above, a divider 36 of rank P the input of which receives the auxiliary signal. The output of the divider 36 supplies the comparison signal the frequency Fcomp1 of which is here equal to F2/P. The equation of the phase-locked loop is therefore written:

$$F2-F1=F2/P$$

i.e.:

$$F1=F2((P-1)/P)$$

In these conditions, the variations of the frequency F2 are passed on to the signal F1 as follows:

$$F1+\Delta F1=(F2+\Delta F2)\ ((P-1)/P)$$

i.e.:

$$F1+\Delta F1=F2((P-1)/P)+\Delta F2\ ((P-1)/P)$$

i.e.:

$$F1+\Delta F1=F1+\Delta F2((P-1)/P)$$

i.e.:

$$\Delta F1=\Delta F2((P-1)/P)$$

Thus, here, the variations of the auxiliary frequency F2 lead to proportional variations of the frequency F1 of the output signal, in a ratio equal to (P−1)/P.

The frequency step ΔF2 of the auxiliary frequency synthesizer 40 is chosen according to the frequency step ΔF1 desired for the output signal of the frequency synthesizer 30:

$$\Delta F2=\Delta F1/((P-1)/P))$$

i.e.:

$$Fq/R=\Delta F1*1/((P-1)/P))$$

Thus, the rank R of the divider 36 is chosen so that:

$$R=Fq/\Delta F1((P-1)/P))$$

As a digital example, the following values can be chosen:
Fq=26 MHz
F1=3.6 GHz (central value of the band F1)
ΔF1=400 KHz
F2=3.9 GHz (central value of the band F2)
Fcomp1=F2-F1=300 MHz
P=13
It results that:
R=Fq/ΔF1 ((P−1)/P))=60
Fcomp2=ΔF2=Fq/R=433 KHz
N=3.9 GHz/433 KHz=9006 (central value of N)

The phase-locked loop of the auxiliary frequency synthesizer 40 has a bandwidth in the order of one tenth of the frequency Fcomp2, and is therefore not immune to spurious signals that can be in the vicinity of the central frequency of the oscillator 41. However, the immunity of the auxiliary frequency synthesizer 40 is obtained here by the fact that the auxiliary frequency F2 is shifted relative to the frequency F1 of the output signal. Thus, if harmonic signals of frequency F1+2F$_{BB}$ (F$_{BB}$ being the frequency of the baseband) are re-injected into the auxiliary frequency synthesizer 40, these signals are outside the amplification range of the oscillator 41. Such an immunity requires a minimum amount of precaution in the choice of the frequency F2, that must be such that the deviation between the frequencies F2 and F1 is at least higher than several tens of times the baseband. In the example given above, the deviation between F2 and F1 is 300 MHz and is therefore more than 1,000 times higher than the baseband, which is generally in the order of 200 KHz. The auxiliary frequency synthesizer 40 is therefore totally immune to harmonic components of the output signal of the frequency synthesizer 30.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

It will be understood by those skilled in the art that various alternative embodiments and various applications of the present invention are possible. In particular, as represented in dotted lines on FIG. 5, two dividers 37, 38 of the same rank D can be added to the frequency synthesizer 30. The divider 37 is arranged between the output of the filter 33 and the first input of the phase comparator 34. The divider 38 receives the signal Fcomp1 and its output is linked to the second input of the phase comparator 34.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An RF integrated circuit of a frequency synthesizer and a QAM modulator for modulating a baseband signal of frequency F$_{BB}$, the frequency synthesizer supplying to the QAM modulator an output signal of frequency F1 adjustable with a frequency step ΔF1, for forming a carrier signal of the QAM modulator, characterised in that the frequency synthesizer is a Vernier effect frequency synthesizer comprising:
an auxiliary frequency synthesizer supplying an auxiliary signal of frequency F2 adjustable with a frequency step ΔF2, and
a main frequency synthesizer supplying the output signal of frequency F1 and having a phase-locked loop for mixing the output signal of frequency F1 with the auxiliary signal of frequency F2, such that the frequency step ΔF1 of the output signal is equal or proportional to the frequency step ΔF2 of the auxiliary signal, and in that the bandwidth of the phase-locked loop of the main frequency synthesizer is as least two times higher than the frequency step ΔF2 of the auxiliary signal.

2. The RF integrated circuit according to claim 1 wherein the deviation between the frequencies F2 and F1 is higher than ten times the baseband frequency $F_{BB}$.

3. The RF integrated circuit according to claim 1 wherein the main frequency synthesizer comprises a voltage-controlled oscillator supplying the output signal of frequency F1, and a phase comparator receiving at input a comparison signal of determined frequency and a subtractive component of frequency F2-F1 supplied by the means for mixing the output signal of frequency F1 with the auxiliary signal of frequency F2.

4. The RF integrated circuit according to claim 3 wherein the frequency of the comparison signal is at least 20 times higher than the frequency step ΔF2 of the auxiliary signal.

5. The RF integrated circuit according to claim 3 wherein the comparison signal is a fixed frequency signal, such that the frequency step ΔF1 of the output signal is equal to the frequency step ΔF2 of the auxiliary signal.

6. The RF integrated circuit according to claim 3 wherein the main frequency synthesizer comprises a frequency divider of rank P receiving the auxiliary signal at input and supplying the comparison signal, such that the output signal has a frequency step ΔF1 equal to the frequency step ΔF2 of the auxiliary signal multiplied by a term that varies according to P.

7. The RF integrated circuit according to claim 3 wherein the frequency F2-F1 of the subtractive component is in the order of 300 MHz.

8. The RF integrated circuit according to claim 1 wherein the auxiliary frequency synthesizer comprises a voltage-controlled oscillator and a phase-locked loop, the voltage-controlled oscillator of the auxiliary frequency synthesizer supplying the auxiliary signal, the phase-locked loop of the auxiliary frequency synthesizer enabling the frequency F2 of the auxiliary signal to be adjusted.

9. The RF integrated circuit according to claim 8 wherein the auxiliary frequency synthesizer is driven by a quartz oscillator linked to a frequency divider of rank R that supplies a comparison signal of determined frequency to the phase-locked loop of the auxiliary frequency synthesizer.

10. The RF integrated circuit according to claim 1 wherein the frequency F2 of the auxiliary signal is higher than the frequency F1 of the output signal.

11. The RF integrated circuit according to claim 1 wherein the frequency F1 of the output signal is on the order of 3 to 4 GHz.

12. The RF integrated circuit according to claim 1 wherein the phase-locked loop of the main frequency synthesizer has a bandwidth between 1 and 30 MHz.

13. The RF integrated circuit according to claim 1 wherein the frequency step ΔF1 of the output signal is on the order of 400 KHz.

14. A method for reducing the injection locking effect in an RF integrated circuit having:
a frequency synthesizer and a QAM modulator for modulating a baseband signal of frequency $F_{BB}$, the frequency synthesizer supplying to the QAM modulator an output signal of frequency F1 adjustable with a frequency step ΔF1, for forming a carrier signal of the QAM modulator, the method comprising:

using, as a frequency synthesizer, a Vernier effect frequency synthesizer;
supplying an auxiliary signal of frequency F2 adjustable with a frequency step ΔF2, and
supplying the output signal of frequency F1;
mixing the output signal of frequency F1 with the auxiliary signal of frequency F2, such that the frequency step ΔF1 of the output signal is equal or proportional to the frequency step ΔF2 of the auxiliary signal; and
selecting the bandwidth of the first phase-locked loop to be at least two times higher than the frequency step ΔF2 of the auxiliary signal.

15. The method according to claim 14, wherein the deviation between the frequencies F2 and F1 is chosen to be higher than 50 times the baseband frequency $F_{BB}$.

16. The method according to claim 14 wherein the main frequency synthesizer comprises a voltage-controlled oscillator supplying the output signal of frequency F1, and a phase comparator receiving at input a comparison signal of determined frequency and a subtractive component of frequency F2-F1 supplied by the means for mixing the output signal of frequency F1 with the auxiliary signal of frequency F2.

17. The method according to claim 16 wherein the frequency of the comparison signal is chosen to be at least 20 times higher than the frequency step ΔF2 of the auxiliary signal.

18. The method according to claim 16 wherein the comparison signal is obtained by dividing the frequency F2 of the auxiliary signal by a number P, such that the output signal has a frequency step ΔF1 equal to the frequency step ΔF2 of the auxiliary signal multiplied by a term that varies according to P.

19. The method according to claim 16 wherein the frequency F2-F1 of the subtractive component is in the order of 300 MHz.

20. The method according to claim 14 wherein the frequency F2 of the auxiliary signal is chosen to be higher than the frequency F1 of the output signal.

21. The method according to claim 14 wherein the frequency F1 of the output signal is in the order of 3 to 4 GHz.

22. The method according to claim 14 wherein the phase-locked loop of the main frequency synthesizer has a bandwidth between 1 and 30 MHz.

23. The method according to claim 14 wherein the frequency step ΔF1 of the output signal is in the order of 400 KHz.

24. A frequency synthesizer for providing an output to a QAM modulator for modulating a baseband signal of frequency, the frequency synthesizer being a Vernier effect frequency synthesizer comprising:
a first output stage that outputs a signal of frequency F1 adjustable with a frequency step ΔF;
an auxiliary frequency synthesizer supplying an auxiliary signal of frequency F2 adjustable with a frequency step ΔF2;
a main frequency synthesizer supplying the output signal of frequency F1 to the output stage;
a mixer that receives the output signal of a frequency F1 and mixes the signals F1 and F2;
a phase-locked loop circuit that receives the output of the mixer of the output signal of frequency F1 with the auxiliary signal of frequency F2 and adjusts the frequency step ΔF1 of the output signal to be equal or proportional to the frequency step ΔF2 of the auxiliary signal, the bandwidth of the phase-locked loop of the main frequency synthesizer being at least two times higher than the frequency step ΔF2 of the auxiliary signal.

25. The frequency synthesizer according to claim 24 further including:
a filter positioned between the output of the mixer and the phase-locked loop such that the signal passes through a filter before entering the phase locked loop.

26. The frequency synthesizer according to claim 24 further including:
a frequency divider positioned between the output of the mixer and the input of the phase-locked loop.

* * * * *

UNITED STATES PATENT AND TRADEMARK OFFICE
CERTIFICATE OF CORRECTION

PATENT NO. : 7,324,788 B2  Page 1 of 1
APPLICATION NO. : 11/036180
DATED : January 29, 2008
INVENTOR(S) : Serge Ramet et al.

It is certified that error appears in the above-identified patent and that said Letters Patent is hereby corrected as shown below:

On the Title page of the Patent
Item (75) Inventors, "Pascal Triaire, Grenoble (FR); Philippe Jouen, Grenoble (FR)" should read as -- Pascal Triaire, Heute Jarrie (FR); Philippe Jouen, Claix (FR) --

Column 11
Line 5, claim 1 "the main frequency synthesizer is as least two times" should read as -- the main frequency synthesizer is at least two times --

Line 16, "frequency F2-F1 supplied by the means for mixing the output signal" should read as -- frequency F2-F1 supplied by a means for mixing the output signal --

Column 12
Line 11, claim 14 "selecting the bandwidth of the first phase-locked loop" should read as -- selecting a bandwidth of a first phase-locked loop --

Line 22, claim 16 "frequency F2-F1 supplied by the means for mixing the output signal" should read as -- frequency F2-F1 supplied by a means for mixing the output signal --

Line 54, claim 24 "adjustable with a frequency step ΔF;" should read as -- adjustable with a frequency step ΔF1; --

Signed and Sealed this

Seventeenth Day of March, 2009

JOHN DOLL
*Acting Director of the United States Patent and Trademark Office*